(12) United States Patent  (10) Patent No.: US 7,534,396 B2
Knebel et al.  (45) Date of Patent: May 19, 2009

(54) DEVICE FOR PROTEIN CRYSTALLISATION (75) Inventors: Günther Knebel, Nürtingen (DE); Allan D'Arcy, Hegeheim (FR); Robert Earl Cudney, Laguna Niguel, CA (US)

(73) Assignee: Greiner Bio-One GmbH, Frickenhausen (DE)

( * ) Notice: Subject to any disclaimer, the term of this patent is extended or adjusted under 35 U.S.C. 154(b) by 525 days.

(21) Appl. No.: 10/512,738

(22) PCT Filed: Apr. 29, 2003

(86) PCT No.: PCT/EP03/04454

§ 371 (c)(1),
(2), (4) Date: Jun. 20, 2005

(87) PCT Pub. No.: WO03/092892

PCT Pub. Date: Nov. 13, 2003

(65) Prior Publication Data

US 2006/0051249 A1 Mar. 9, 2006

(30) Foreign Application Priority Data

Apr. 30, 2002 (AT) ................ A 668/2002

(51) Int. Cl.
*B01L 3/00* (2006.01)
(52) U.S. Cl. ...................................... 422/102
(58) Field of Classification Search ............ 422/102
See application file for complete search history.

(56) References Cited

U.S. PATENT DOCUMENTS

| 3,728,228 | A | 4/1973 | Duranty |
| 4,204,045 | A | 5/1980 | Kjellander et al. |
| 4,673,651 | A | 6/1987 | Rothenberg et al. |
| 5,429,236 | A | 7/1995 | Evans |
| 2001/0032582 | A1 | 10/2001 | DeTitta et al. |

FOREIGN PATENT DOCUMENTS

| GB | 2 321 446 | 7/1998 |
| GB | 2321446 | 7/1998 |
| WO | WO 99/42608 | 8/1999 |

(Continued)

OTHER PUBLICATIONS

Chayen N. E. et al: "Microbatch Crystallization under Oil—a New Technique Allowing Many Small-volume Crystallization Trials" Journal of Crystal Growth, North-Holland Publishing Co. Amsterdam, NL, Bd. 122, Nr. 1/4, Aug. 2, 1992, Seitan 76-180, XP 000306492 Issn: 0022-0248 (ISR).

(Continued)

*Primary Examiner*—Walter D Griffin
*Assistant Examiner*—Bobby Ramdhanie
(74) *Attorney, Agent, or Firm*—Collard & Roe, P.C.

(57) ABSTRACT

The invention relates to a container (1) with a base body (2), comprising a base plate (3) and side walls (4) standing out therefrom in an at least approximately perpendicular arrangement, and with wells (5) disposed in the base body (2). The wells (5) are provided in the form of a recess in the base plate (3) and the side walls (4) of the base plate (3) are disposed in at least the approximately opposite direction from the recesses in order to accommodate a volume.

27 Claims, 11 Drawing Sheets

FOREIGN PATENT DOCUMENTS

| | | |
|---|---|---|
| WO | WO9942608 | 8/1999 |
| WO | WO 99/55826 | 11/1999 |
| WO | WO9955826 | 11/1999 |
| WO | WO 02/081785 | 10/2002 |
| WO | WO02081785 | 10/2002 |

OTHER PUBLICATIONS

Chayen N. E. et al: "Microbatch Crystallization under Oil—a New Technique Allowing Many Small-volume Crystallization Trials" Journal of Crystal Growth, North-Holland Publishing Co. Amsterdam, NL, Bd. 122, Nr. 1/4, Aug. 2, 1992, Seitan 76-180, Xp 000306492 Issn: 0022-0248.

D'Arcy, et al: "A novel approach to crystallising proteins under oil" Journal of Crystal Growth 168 (1996) 175-180 Enclosed.

Introduction to protein crystallisation. http://www-cryst.bioc.cam. ac.uk/~dima/xtal-in-action/node3.html Feb. 26, 2003 pp. 1-11. Enclosed.

"Crystallisation Under Oil" Hampton Research. Enclosed, Date: 2001, Laguna, CA.

International Search Report, Aug. 29, 2003.

DEVICE FOR PROTEIN CRYSTALLISATION

CROSS REFERENCE TO RELATED APPLICATIONS

Applicants claim priority under 35 U.S.C. §119 of Austrian Application No. A668/2002 filed on Apr. 30, 2002. Applicants also claim priority under 35 U.S.C. §365 of PCT/EP03/04454 filed on Apr. 29, 2003. The international application under PCT article 21(2) was not published in English.

The invention relates to a container with a base body comprising a base plate and side walls standing up therefrom in an at least approximately perpendicular arrangement and with wells disposed in the base body, a unit for dividing a volume of a container into part-regions and a crystallization device, as well as the use of the container, the unit and the crystallization device.

From sequencing the human genome, it is now known that there are approximately 30,000 human genes. This corresponds to approximately 1% of the human genome. Every gene in the human genome in turn encodes more than one protein. It is therefore assumed that there are between 200,000 and 500,000 proteins, although only a fraction of the proteins is expressed in a specific cell type. In addition, proteins are also subject to post-translational changes. These take place before the proteins unleash their ultimate biological function.

In the meantime, it has been learned that even slight protein modifications and changes in the nature of protein interactions and protein localization can have a dramatic effect on the cell physiology. The conformation of a protein is also an essential factor in understanding the role which it plays. The form of a protein is also of great relevance in pharmacological terms because most pharmaceuticals unleash their effect on the basis of their capacity to interact with a specific protein molecule.

In order to understand a bio-macro molecule at atomic level, it is necessary to know what its three-dimensional structure is. The best method of obtaining structural information about the bio-macro molecule is through X-ray crystallography. This enables the structure of a crystal to be determined by measuring the reflection and bending of X-rays in the planes of the lattice network. Another method of analyzing protein structure, nuclear magnetic resonance spectroscopy (NMR), is limited to smaller proteins, at present up to a maximum 200 to 300 kDa, from solutions. In the case of X-ray crystallography, there is no upper limit to the size of the proteins which can be analyzed, provided appropriate crystals can be obtained.

The morphology of a crystal is regarded as the result of an intrinsic regularity. Organic materials can also form crystals. However, organic molecules and proteins are found in crystalline form only very rarely in nature and conditions therefore have to be found in which protein crystals can be grown in order to determine their structure. Some proteins crystallise very readily, whilst in the case of others, finding suitable crystallisation conditions is very time-consuming. To this date, there are some proteins which it has not been possible to crystallise.

Protein crystallisation is often also described as an art because a crystal grower not only requires enormous perseverance and patience, but also a lucky hand.

Most bio-macro molecules, e.g. proteins, are only active if the polypeptide chains are present in their native, correctly coded state. They must therefore be crystallised from aqueous solutions under conditions in which they will not be denatured. Crystallization is initiated by adding an appropriate precipitation agent, which leads to over-saturation and thus causes the protein to precipitate or crystallise. All crystallisation experiments depend on a number of parameters, such as pH value, concentration of the precipitation agent, temperature, ion concentration, ligands, etc., for example. Crystallization will also not occur unless the right combination of specific parameters prevails. Every protein behaves individually and differently and optimum crystallisation conditions vary from one to another, which means that they are found either by chance or as a result of an enormous amount of work.

Proteins carry amino acids with charged ion groups on their surface. It is thus necessary to find conditions under which the protein molecules slowly associate with one another in sequence. In the case of protein crystallisation, this can be achieved by slowly changing the quantity of water in which the protein is dissolved, e.g. by means of inorganic salts. The salt binds water molecules when it dissolves because it surrounds itself with a sheath of water so that this water molecule extracts the protein. Once the saturation point is exceeded, the protein starts to precipitate. Crystallization can also be obtained using the reverse process, whereby the quantity of water is increased, which then enables a hydrophobic enzyme to be crystallised. In addition to salts, surface-active substances such as the detergent, polyethylene glycol, can be used as a means of acting on the protein hydrate sheath. In order for the protein to finally crystallise, the pH setting must be correct and the temperature must be correct. Protein crystals contain numerous water molecules in the crystal lattice (30% to 70%). If they were treated in the same way as crystals of low-molecular organic or inorganic substances, they would dry out—after which the entire crystal could end up being damaged.

A structural analysis will produce an image of the content of the elementary cell in the form of an electron density because the X-ray is bent by the electrons. How accurately and in what detail the electron density can be determined depends on the spatial resolution and ultimately the quality of the measured crystal. Irregularities and structural faults in the crystal reduce the resolution.

Methods have been devised for testing as many different crystallisation parameters as possible. In situations where a large number of proteins has to be screened in order to find a crystal suitable for X-ray crystal analysis, it is necessary to automate the crystallisation experiment.

The widely available Linbro plate used for protein crystallisation contains 24 wells, each with a well capacity of approximately 3 ml, which then have to be individually closed with 24 glass covers. Although the first robots designed to automate crystallisation experiments with this plate are now on the market, they do not meet the requirements for the high throughput screening necessary for three-dimensional protein structure analysis. Another disadvantage of the Linbro plate is that its format does not conform to the standardised micro-titre plate format, which makes very cost-intensive adjustments to the robot system necessary in order to work with this format.

Crystallization plates with 24 wells have proved particularly effective as a means of crystallising proteins using the so-called "hanging drop" and "sitting drop" methods. In view of the fact that, very often, only small quantities of purified protein (a few milligrams) are available, the "hanging drop" method is currently the method of choice for protein crystallisation. A 5 μl to 15 μl drop of concentrated protein solution is placed on a microscope slide with appropriate precipitation substances. This glass slide is then placed upside down above a reservoir containing approximately 500 μl of a concentrated solution of precipitation substances without proteins, so that the drop with the protein solution is positioned directly above the reservoir solution (retained on the slide by adhesion forces). The glass cover forms a seal together with silicone oil applied to the well so that the system is hermetically sealed from the outside. As equilibrium is reached between the two solutions, the protein can crystallise.

As yet, the crystallisation mechanism is not fully understood and a great deal of effort is needed in order to describe the structure of bio-macro molecules. Micro-plates with 24 wells for crystallisation are known from the prior art, although the degree of automation available for these plates is very low because standardised automation tools are designed for micro-plates with 96 wells or a multiple thereof. Automation is therefore only possible using expensive, specially designed pipette and detection systems. Furthermore, only a small number (namely 24) of bio-macro molecules can be analyzed with these plates. These plates are primarily designed for crystallising bio-macro molecules by the "hanging" and "sitting drop" methods and can not be analyzed by means of the crystallisation under oil method (micro-batch method).

Accordingly, the objective of the invention is to propose a way of increasing the degree of automation which may be used in analyzing bio-macro molecules. One particular part-objective of the invention is to propose a device for crystallising bio-macro molecules, which enables a plurality of different parameters to be tested simultaneously.

This objective is achieved by the the container in accordance with the invention. The fact that the wells are provided in the form of recesses in the base plate has proved to be an advantage because the level of the covering hydrophobic liquid does not need to be as high. Firstly, this low level of hydrophobic liquid prevents the liquid seeping along the side walls of the container due to capillary action, thereby avoiding any risk of contamination, for example due to work surfaces that have not been cleaned, both for the laboratory personnel and for other analyses. Secondly, costs are reduced as a result of the smaller amount of hydrophobic liquid needed. A lower level of hydrophobic liquid is also conducive to the crystallization behavior of the bio-macro molecules because the crystallization process starts more quickly. Another advantage is the fact the volume of both the precipitation solutions needed for the reaction and the bio-macro molecule to be analyzed is smaller.

In accordance with an embodiment of the invention, the fact that the wells have the same disposition, identical movements parallel with the support surface are advantageously always effected relative to the same reference points of the wells, even for different wells, when the container is manipulated on an automated basis.

Also of advantage is the fact that many different bio-macro molecules can be analyzed at the same time, in accordance with an embodiment of the invention.

In an advantageous embodiment, the standardized layout of the conical or cylindrical wells makes for a container of a design which is very economical on space. Particularly good use is made of all the available space by the wells.

Also of advantage is an embodiment whereby only a small quantity has to be used for the reaction. Using small quantities means that an analysis is particularly cost effective.

Another embodiment is of advantage because the regular layout of the wells makes the container very easy to process. The process of filling the wells is facilitated and the sample can be easily observed during processing and harvesting of the crystals.

Another embodiment has proved to be of particular advantage because the formation of bio-macro molecules can be improved by means of a surface treatment.

The design of the container of another embodiment has advantages, whereby the wells are curved in an at least approximately convex arrangement, the advantage of which is that liquid drops are more easily accommodated in wells of this shape and the drops migrate more readily to the center of the well. When placing a liquid drop in position, the surface tension due to the adhesion between the walls of a recess and the boundary surface of the liquid drop has less of a counter-acting effect, the more closely the shape of the recess conforms to the approximately spherical curvature of a drop of liquid.

The advantage of another embodiment is that it facilitates automated processing of the container and in particular of the wells for the purpose of crystallizing bio-macro molecules.

Another embodiment has also proved to be of advantage because it enables a visual control during the work process and during incubation of the container. Consequently, once the reaction mixture has been prepared, it is easier to intervene in the reaction.

Also of advantage is an embodiment whereby the partially non-transparent design prevents stray light which might distort the measurement results during detection.

Also of advantage is an embodiment whereby the drops in the wells are prevented from shifting or sliding, even though their walls are of a minimum height of only 0.1 mm, for example, thereby ensuring that the bio-macro molecule remains in the same position during the reaction and analysis process.

Another embodiment is of advantage because the materials are resistant to organic solvents such as acetone, benzene, acetonitrile, dioxan, 2,2,2 trifluoroethanol, for example. They are also compatible with various salts, buffers and polymers which are frequently used for crystallization purposes. Polypropylene and cyclo-olefin co-polymers (COC) are also less permeable to water vapor and therefore less susceptible to the effect of evaporation than containers made from polystyrene, for example.

Also of advantage is an embodiment defined whereby the use of different plastics to make the container enables different properties to be obtained. For example, the wells need only be resistant to stress caused by organic solvents, whereas the side walls do not have to satisfy this requirement.

In another embodimentls, the container is easy to orient when working with it. Furthermore, by marking the container accordingly, an internal control system and orientation system can be incorporated for automated processing.

Also of advantage is another embodiment whereby the selected production method enables the container to be manufactured rapidly and inexpensively.

Another embodiment has proved to be of advantage, whereby the standardized dimensions of the container enable the jobs which have to be carried out with the container to be automated. The possibility of automating processing means that a large number of samples can be analyzed simultaneously. Since the layout of the wells conforms to the SBS standard, a very high density of wells is also obtained. Another advantage is the fact that automation enables several wells to be filled at the same time. Yet another advantage of this embodiment is the fact that the same filling and test systems as those used with micro-titre plates can be used for the container proposed by the invention because the number of wells is standardized.

An embodiment has proved to be of advantage, whereby the recess can be filled with a liquid, and evaporation of the crystallization reagents and hydrophobic liquid reduced, which means that the concentrations of these reagents can be kept constant during the entire reaction process and analysis process.

An embodiment has proved to be of advantage because it incorporates at least one retaining element, which means that the unit for dividing a volume of a container into part-regions has to be placed in a predefined position, thereby ensuring that the experiment is more readily reproducible.

The objective of the invention is also independently achieved by the unit in accordance with the invention. The advantage of this approach is that by placing the unit in the container, fluctuations in the liquid level can be kept to a minimum when transporting the container. Another advantage is the fact that fluctuations in the hydrophobic liquid coating the wells can be compensated. During both manual and automated processing of the container, it is constantly susceptible to slight vibrations, which can shift the position of the bio-macro molecule and could thus disrupt the crystallization process. Using the unit ensures that the positioning of the bio-macro molecule in the recess can be kept constant during the entire crystallization process, which can last several days and even a few months, even if the container has to be moved from one place to another several times.

Another advantage is the fact that, because it acts like a breakwater, processing can be efficiently automated at a higher speed. The wells can nevertheless be thoroughly coated with the hydrophobic liquid because the webs are disposed at a distance from the support surface and the concentration of hydrophobic liquid in each recess and in all the wells remains constant.

This being the case, an embodiment is of advantage, whereby greater strength can be imparted to the unit. As a result of the increase in strength, the unit can be manipulated during the experiment. Furthermore, once it has been thoroughly cleaned, it can be used several times for different experiments.

As a result of another embodiment, a flow connection can be established between the part-regions. As a result of this flow connection, differences in concentration between the part-regions can be compensated, thereby guaranteeing the same reaction conditions throughout the entire container.

In another embodiment, conformity is achieved in the layout of the wells in the container, thereby facilitating automated processing.

This being the case, another embodiment ther has proved to be of advantage because the fact that the webs are spaced at a sufficient distance from the support surface enables the quantity of hydrophobic liquid to be distributed over the entire base plate of the container, thereby establishing a flow connection between the individual part-regions.

Another embodiment has proved to be advantage, whereby a fluid-tight barrier for the hydrophobic liquid is obtained when the webs are placed against the base plate. Consequently, when the webs are placed against the base plate, many different hydrophobic liquids, such as silicone oil or paraffin oil can be tested on a base plate or, for example, many different ratios of the hydrophobic liquid can be tested relative to one another, such as silicone oil to paraffin oil in a ratio of 1:1 or 1:2 or 2:1, etc. Another advantage is the fact that by creating the part-regions, a row can be used for diluting different reagents involved in the reaction, for example the precipitation solution, for test purposes.

Another embodiment is also of advantage because the fact that the unit is spaced apart from the side walls makes it easier to insert the unit in and remove it from the container. Another advantage is the fact that because spacers can be used, the frame does not have to be exactly adapted in the container.

Also of advantage is an embodiment whereby the unit is made easier to manipulate, especially easier to insert in and remove from the container.

The objective of the invention is also independently achieved as a result of the crystallization device in accordance with the invention. The advantage of this approach is that both reagent consumption and consumption of the bio-macro molecules can be reduced to a minimum. Another advantage is the fact that experiments with the same starting substance can be repeated several times, thereby obviating the need for lengthy processes to produce more of the bio-macro molecule. Also of advantage is the fact that the same bio-macro molecule obtained from an isolation process can be used several times, thereby ruling out differences in the analysis results due to different isolation conditions.

The objective of the invention is also independently achieved by using the container in accordance with the invention. The advantage of this approach is that a plurality of proteins can be crystallized simultaneously under the same conditions.

The objective of the invention is also independently achieved by using the device in accordance with the invention. The advantage of this approach is that the unit acts in the manner of a breakwater for the hydrophobic liquid.

The objective of the invention is also independently achieved by using the crystallization device in accordance with the invention. The advantage of this is that the large number of crystallization experiments which can be carried out in a short time prevents any degradation of the bio-macro molecule. Furthermore, various different crystallization conditions for a bio-macro molecule can be tested simultaneously.

In order to provide a clearer understanding, the invention will be explained in more detail below with reference to the appended drawings, which provide simplified, schematic diagrams of a container for holding samples.

The invention will be explained in more detail with reference to examples of embodiments illustrated in the appended drawings.

Of these.

Firstly, it should be pointed out that the same parts described in the different embodiments are denoted by the same reference numbers and the same component names and the disclosures made throughout the description can be transposed in terms of meaning to same parts bearing the same reference numbers or same component names. Furthermore, the positions chosen for the purposes of the description, such as top, bottom, side, etc,. relate to the drawing specifically being described and can be transposed in terms of meaning to a new position when another position is being described. Individual features or combinations of features from the different embodiments illustrated and described may be construed as independent inventive solutions or solutions proposed by the invention in their own right.

Protein crystallisation permits access to the three-dimensional structure of any protein. In addition, it is also in a position to bridge the gap between genomic and structural information about bio-macro molecules. Not only is the presence of the protein vital to its function, but also its conformation. The structure of the protein also provides important information about interactions with other molecules.

Figure 1:
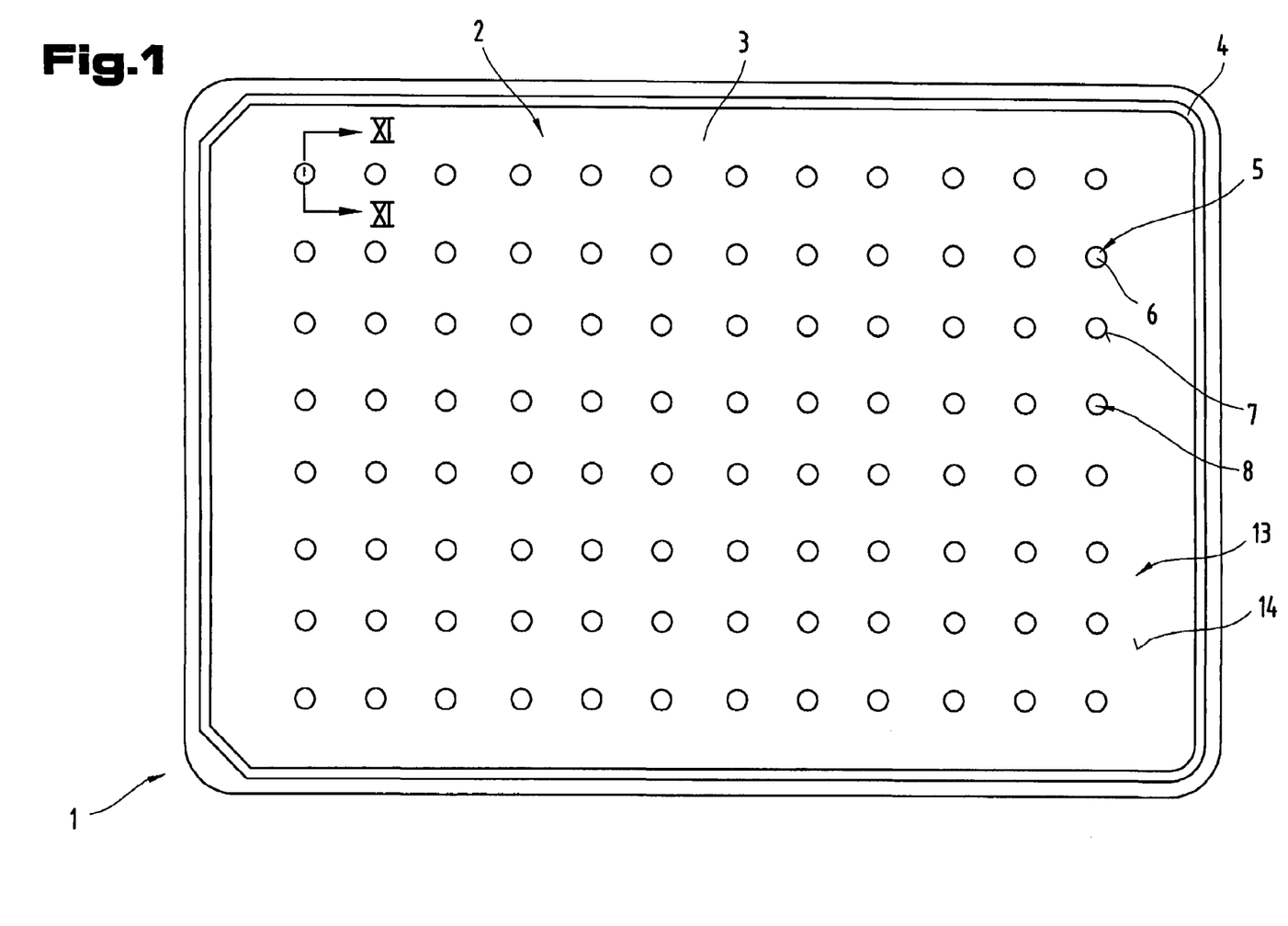
FIG. 1 shows a container with 96 wells for holding samples.
Figure 2:
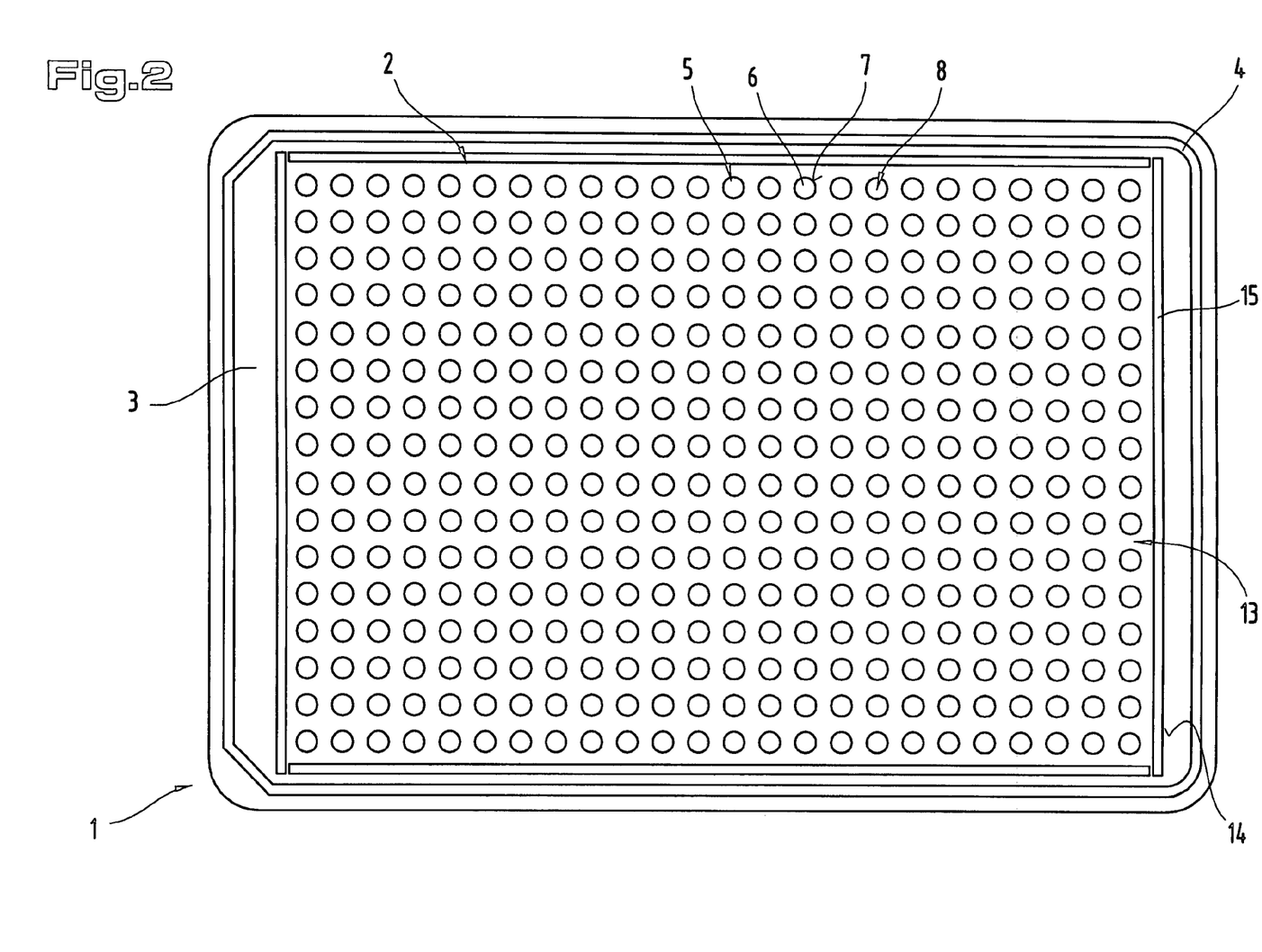
FIG. 2 shows a container with 384 wells for holding samples.

FIGS. 1 and 2 show a plan view of a container 1 with a base body 2, consisting of a base plate 3 and side walls 4. The base plate 3 has wells 5, which are formed by the base 6 and the walls 7. The side walls 4 surround the reaction region 8. A container 1, of the type illustrated in FIGS. 1 and 2, is suitable for conducting tests where miniaturization is of particular importance. For example, it is possible to provide a large number of wells 5 in a base body 2 of a container 1 specifically designed for this purpose, thereby simultaneously obtaining a large number of reaction regions 8. FIGS. 1 and 2 illustrate an example of a layout of a plurality of wells 5 in a container 1, that illustrated in FIG. 1 having 96 wells 5 and that illustrated in FIG. 2 having 384 wells 5. The base body 2 of the container 1 is designed to the standard size of a micro-titre plate and its dimensions conform to the recommendations of the SBS (Society of Biomolecular Screening; www.SBSonline.org), in which case the container 1 has an overall height selected from a range with a lower limit of 6 mm, preferably 8 mm, in particular 10.4 mm, and an upper limit of 22 mm, preferably 16 mm, in particular 14.4 mm.

The wells 5 are arranged in a rectangular pattern. Accordingly, the respective adjacent wells 5, which each have their own separate walls 7, are separated from one another in mutually parallel rows. These rows are aligned parallel with the longitudinal extension of the container 1 and the consecutive rows of wells 5 are disposed at an equal distance from one another. In an alternative embodiment of a container 1, the rows may also be disposed perpendicular to the longitudinal extension.

The wells 5 are arranged in rows. The concept of a row in all cases should be construed in the geometric sense as being a linear arrangement of identical objects, so that respective identical points of the objects lie on a common straight line. The wells 5 constitute a reaction region 8, each well 5 having a separate wall 7. If the wells 5 are disposed in a very dense pattern, adjacent wells 5 may have a common wall 7.

The side walls 4 of the base plate 3 constitute the container support surface at their bottom edge. The bases 6 of the wells 5 are disposed in a plane parallel with the support surface. The distance of the bases 6 of the wells 5 from the surface 14 of the base plate 3 is shorter than the distance of the bottom edge of the side walls 4 of the container 1 from the surface 14 of the base plate 3. The bases 6 of the wells 5 are therefore disposed at a distance selected from a range with an lower limit of 0.1 mm, in particular 0.3 mm, preferably 0.5 mm, and an upper limit of 7 mm, in particular 6 mm, preferably 5 mm. It has also been found to be of advantage if the distances are selected from a range with an upper limit of 0.7 mm, in particular 1 mm, preferably 1.5 mm, and an upper limit of 4 mm, in particular 3 mm, preferably 2 mm.

In an alternative embodiment, the base plate 3 may be disposed in a plane parallel with the support surface, on which the base 6 of the wells 5 is also disposed. Accordingly, the base plate 3 and the bases 6 of the wells 5 are disposed on the same plane in this embodiment. The top edge of the walls 7 of the wells 5 therefore lies in a plane parallel with the support surface but at a greater distance than the plane in which the base 6 of the wells 5 is disposed.

In the reaction region 8, the wells 5 have the capacity to hold a volume selected from a range with a lower limit of 0.01 μl, preferably 0.5 μl, in particular 0.1 μl, and an upper limit of 50 μl, preferably 10 μl, in particular 5 μl. The wells 5 have a diameter selected from a range with an upper limit of 10 mm, preferably 7 mm, in particular 5 mm and a lower limit of 0.1 mm, preferably 0.3 mm, in particular 0.5 mm. What have been found to be of particular advantage are diameters selected from a range with an upper limit of 4 mm, preferably 3 mm, in particular 2 mm and a lower limit of 0.6 mm, preferably 0.7 mm, in particular 0.9 mm. The height of the wells 5 is selected from a range with a lower limit of 0.1 mm, preferably 0.2 mm, in particular 0.3 mm and an upper limit of 12 mm, preferably 10 mm, in particular 6 mm. It has been found that heights of wells selected from a range with a lower limit of 0.5 mm, preferably 0.6 mm, in particular 0.8 mm, and an upper limit of 5 mm, in particular 3 mm, preferably 2 mm, and more especially of 1 mm, are of particular advantage.

The container 1 and the wells 5 are designed to hold liquids and solutions. The container 1 is specifically designed to hold hydrophobic liquids 9 and the wells 5 are specifically designed to hold the drop 10 consisting of a bio-macro molecule 11 combined with crystallisation reagents 12, which determine what hydrophobic liquid 9 is used. The reservoir 13 is filled with the hydrophobic liquid 9 to a level whereby the hydrophobic liquid 9 also moves into the wells 5 of the container 1 during deployment of the container 1 in its position of usage. In other words, the entire surface 14 of the base plate 3 of the container 1 is therefore covered with the hydrophobic liquid 9. The wells 5 are designed for conducting reactions, which are intended to produce a crystal from bio-macro molecules 11 dissolved in crystallisation reagents 12.

The surface 14 of the base plate 3 may be surface-treated between the wells 5 with a hydrophobic substance, such as grease, in particular silicone grease, oil, polyethylene glycol, polytetrafluoroethylene, for example. Alternatively, a hydrophobic mask may also be applied to the surface 14 of the base plate 3, so that the drop 10 is disposed in the reaction region 8 and the hydrophobic liquid 9 is between the reaction regions 8. As a result of the hydrophobic intermediate spaces, the drop 10 remains in the same position of the container 1 during the entire analysis. The surface 14 of the base plate 3 between the reaction regions 8 may also have a matt structure.

The container 1 is specifically used for crystallising bio-macro molecules 11 under a hydrophobic liquid 10, also known as the "micro-batch method". Crystallization under oil is a method whereby a small drop 10 consisting of a bio-macro molecule 11 combined with crystallisation reagents 12 is pipetted under a layer of oil. The ratio of the volume of the bio-macro molecule 11 to the crystallisation reagents 12 needed for this purpose is usually a ratio by volume of 1:1 and the drop 10 comprises a total volume of from 1 μl to 2 μl. However, it is also possible to pipette drops 10 with a volume of up to 5 μl into the wells 5. The most commonly used hydrophobic liquids 9 are paraffin oil or silicone oil or a mixture of these two oils, usually in a ratio of 1:1. However, other ratios of paraffin oil to silicone oil may also be used in order to vary the diffusion rate of the drop (the higher the percentage of silicone oil, the more rapidly diffusion and evaporation occur).

The material used to make the base 6 of the wells 5 may optionally be transparent and the base plate 3 may be made from a non-transparent or light-screening material or with a non-transparent or light-screening coating. The light-screening effect prevents any disruptive influences due to stray light when visually observing the progress of the reaction in the reaction regions 8. The container 1 may naturally also be made entirely from a transparent or non-transparent plastic.

Figure 3:
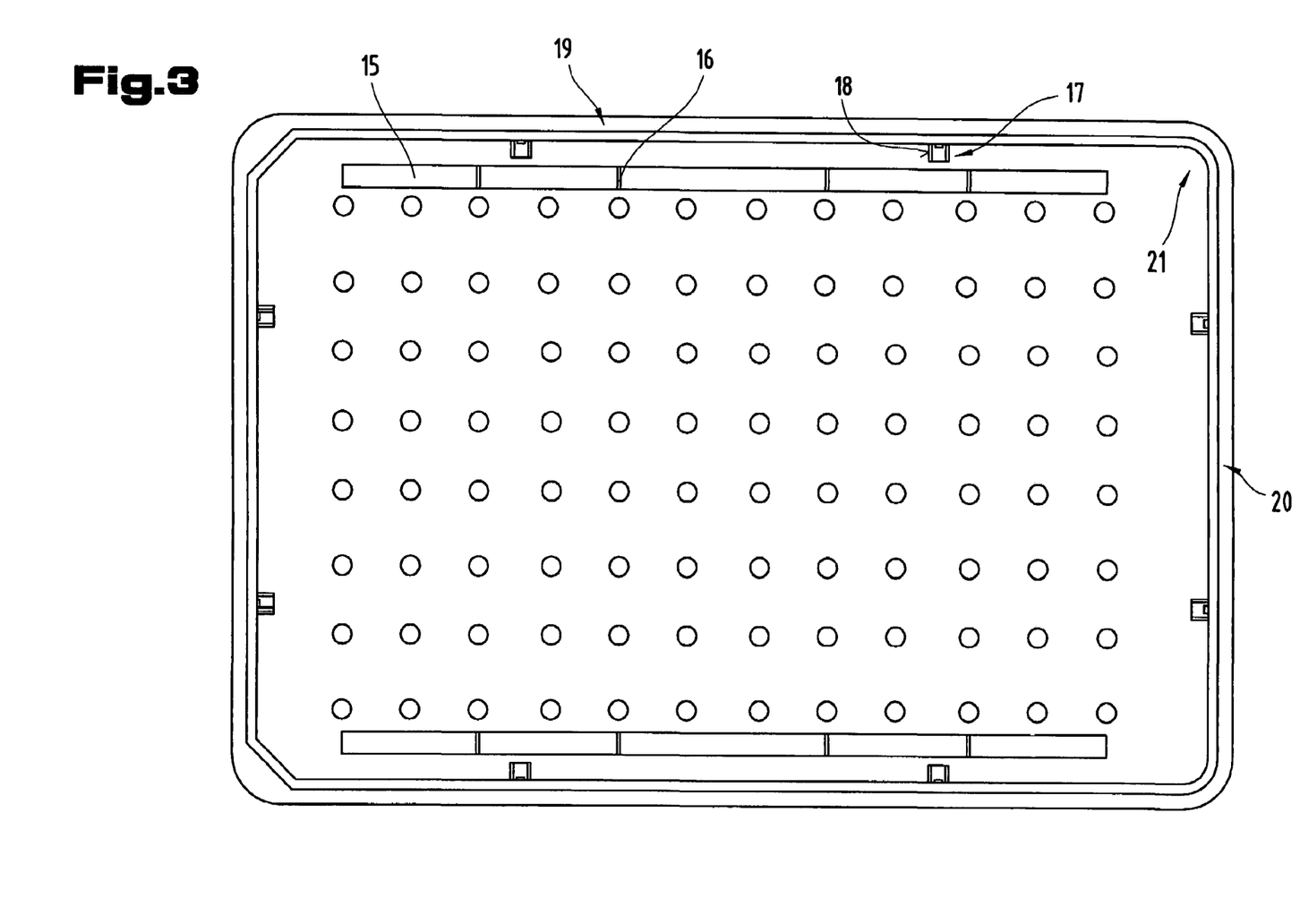
FIG. 3 shows a container with 96 wells incorporating a retaining element for a unit.

FIGS. 2 and 3 show recesses 15, which may be provided both at the longitudinal side 19 and at the transverse side 20 of the base body 2 or either on the longitudinal side 19 or on the transverse side 20. The recess 15 may additionally be split into several smaller part-regions by means of dividing walls 16. The purpose of the recesses is to hold liquids, in which case different liquids or different concentrations of the same liquid may be placed in each part-region, for example, which prevents or minimizes evaporation of the crystallisation reagents 12 and hydrophobic liquid 9. The top edge of the boundaries of the recesses 15 lies on the same plane as the top edge of the walls 7 of the wells 5. Alternatively, the surface of the recess may also be disposed in a parallel plane, but at a greater distance from the support plane than the plane of the top edge of the walls 7 of the wells 5.

Figure 4:
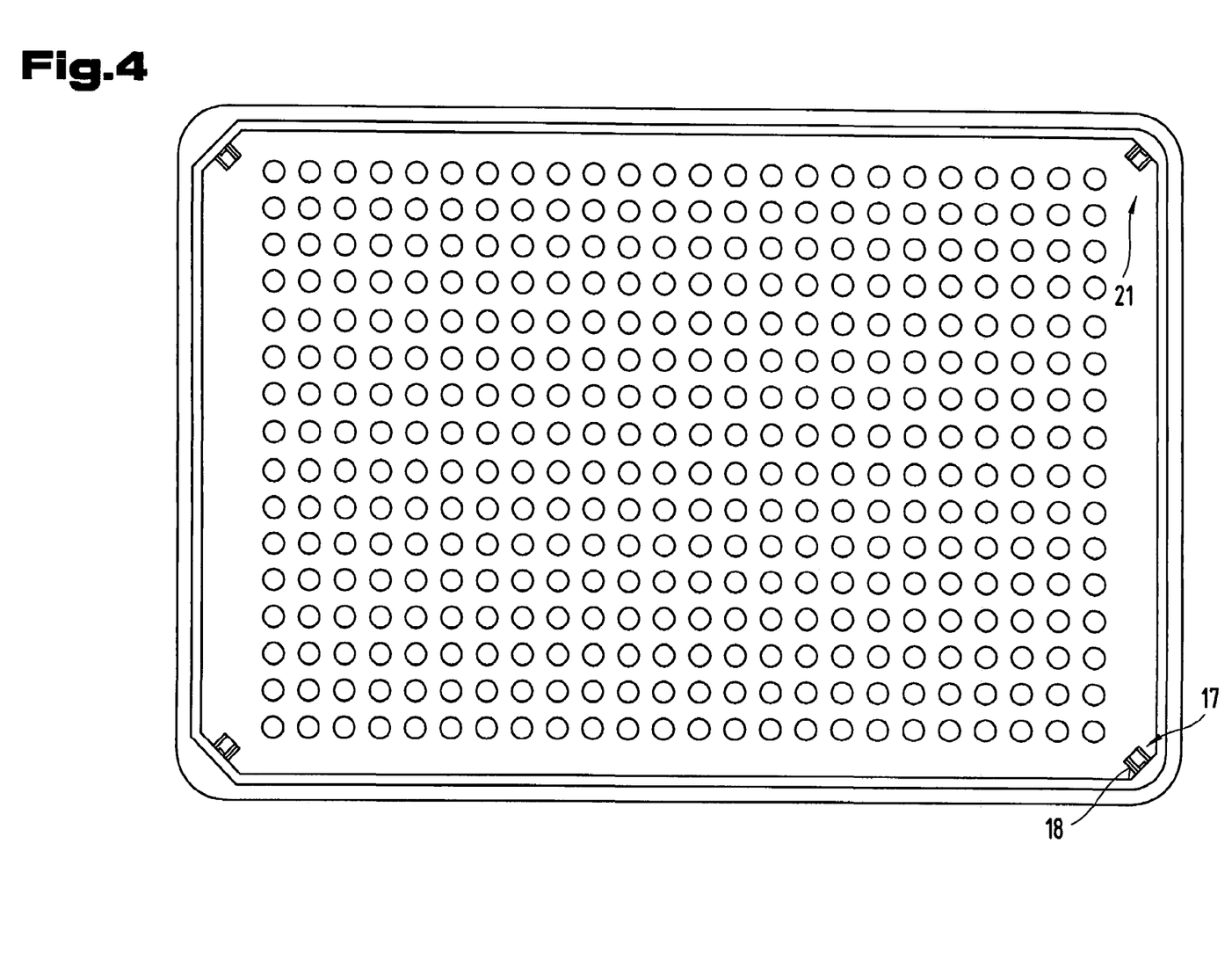
FIG. 4 shows a container with 384 wells incorporating a retaining element for a unit.

FIGS. 3 and 4 show retaining elements 17 disposed on the side walls 4 of a container 1 proposed by the invention. The retaining elements 17 comprise two side parts 18, which may optionally also be joined to the base plate 3. The side parts 18 are arranged at a distance apart so that a spacer 26 of a unit 22 can be inserted between the two side parts 18 of the retaining element 17. The retaining elements 17 may be provided both on the longitudinal side 19 as well as on the transverse side 20 of the side walls 4 of the container 1. Another possibility is to provide retaining elements 17 in the corners 21 of the container 1. A retaining element 17 of the unit 22 for dividing a volume prevents the unit from inadvertently sliding in the event of the container 1 being moved during processing. Any number of retaining elements 17 may be provided on the side walls 4 of the base body 2. In FIG. 3, for example, eight retaining elements 17 are illustrated, in which case two retaining elements 17 are provided on each longitudinal side 19 and on each transverse side 20 of the base body 2. In FIG. 4, four retaining elements 17 are provided, each being disposed in the corners 21 of the base body 2. The spacers 25, which are disposed on the frame 24 of the unit 22, are inserted in the retaining elements 17 on the side walls 4 or the base plate 3 of the container 1. The unit 22 is therefore flexible and can be removed at any time and used for other analyses. In an alternative embodiment, the unit 22 may also be mounted on the side walls 4 or the base plate 3 of the container 1 without retaining elements 17, for example by means of adhesive. These layouts of the retaining elements 17 should be construed as examples of how the retaining elements may be laid out. Naturally, any other layout could be selected for the retaining elements 17.

The number of wells 5 in the base body 2 may be selected from a group comprising the product of the mathematical formula $3 \times 2^n$, where n is a whole number. Naturally it would also be possible to make containers 1 with a different number of wells 5 corresponding to one of the standard sizes of micro-titre plates, such as 24, 48, 96, 384, 1536 etc., for example.

As seen in plan view, the wells 5 have a circular base surface. The available capacity and the base surface of the base plate 3 is used very efficiently by the layout of wells 5, as illustrated in FIGS. 1 to 4. Naturally, the base surface of the wells 5 may also be rectangular, square or in the shape of a parallelogram. Another possibility would be to arrange the mutually parallel rows of wells 5 offset from one another in the longitudinal direction of the container 1. In another embodiment, it would also be possible to provide wells 5 with a regular hexagonal cross-section and dispose the wells 5 in a honeycomb pattern. The best design of wells 5 for automated processing of the container 1 with standardised laboratory robots is one with a circular base surface in rows.

The container 1 is preferably made from polystyrene or COC. Naturally, the container 1 may also be made from a different material, by preference plastics, which are suitable for molding by injection-molding techniques, such as polypropylene, acrylo-butadiene styrene, polyamide polycarbonate, polymethyl methacrylate, polysulphone and/or styrene acrylonitrile, etc. for example. A combination of two or more materials or different plastics may be used, in which case the COC might be used for the wells 5 and polystyrene for the base plate 3. In an alternative embodiment, the base plate 3 and the wells 5 are made from COC and the side walls 4 from polystyrene.

Markings may be provided in the base plate 3 of the base body 2 or on the side walls 4 to indicate co-ordinates of the container. The markings may be both optically visible or be evident in the form of slight changes in the surface 14, which can be recognised by an automatic laboratory manipulation system.

Figure 5:
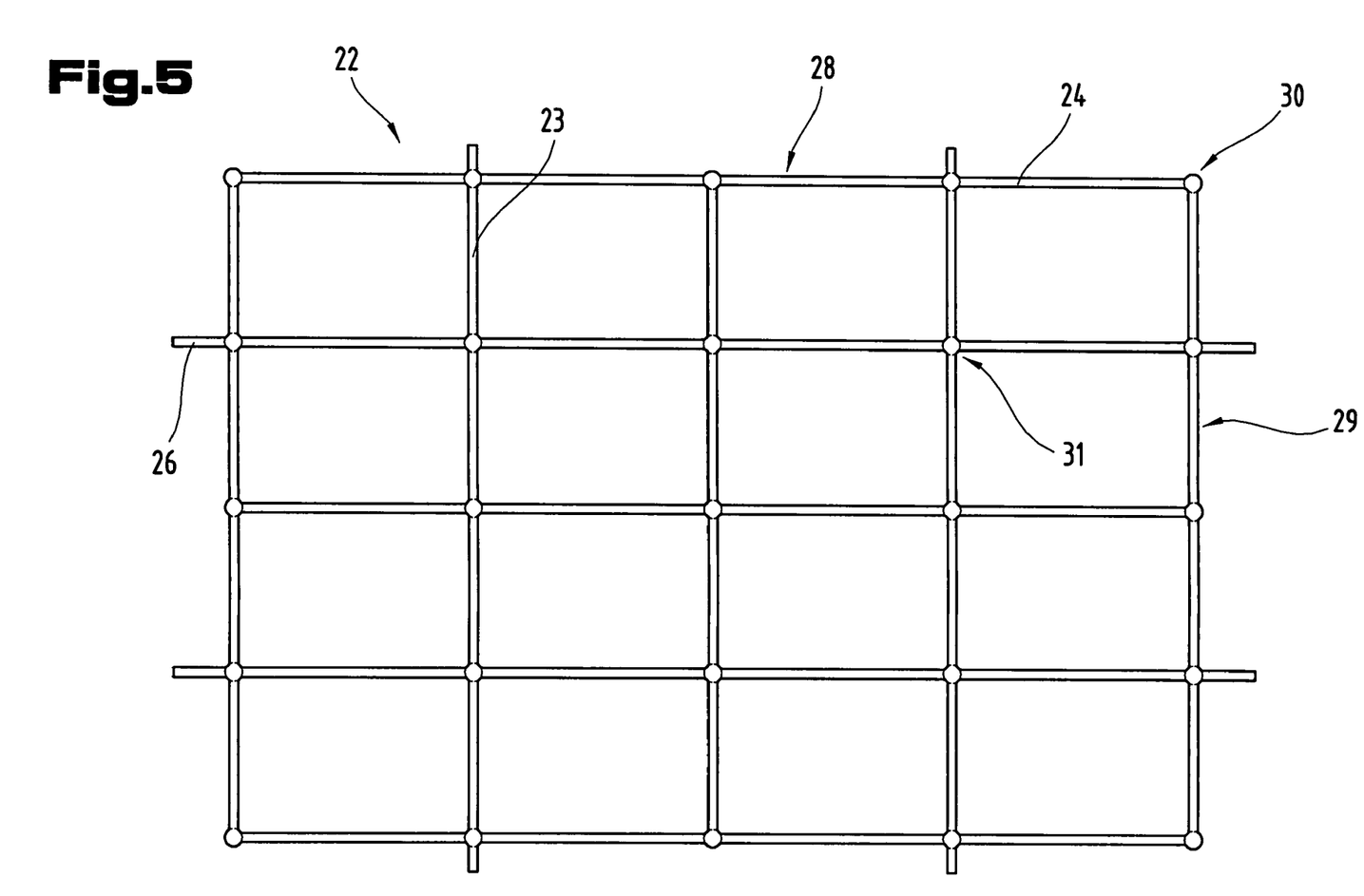
FIG. 5 shows a unit for dividing a volume, with lateral spacers disposed in a 4×4 pattern.
Figure 6:
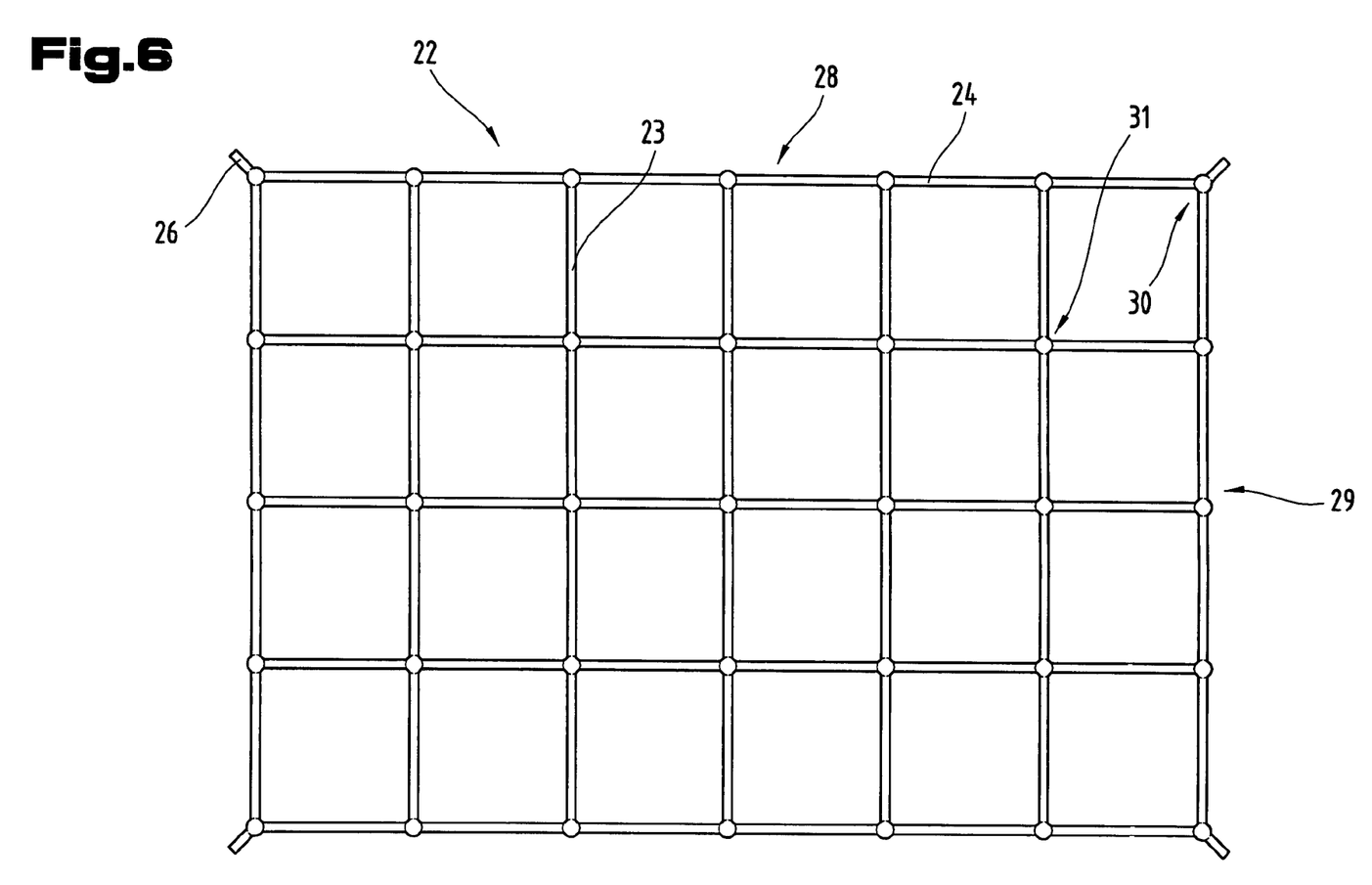
FIG. 6 shows a unit for dividing a volume, with lateral spacers disposed in a 6×4 pattern.

FIGS. 5 and 6 show a plan view of a unit 22 for dividing a volume into part-regions, the unit 22 being made up of webs 23 disposed at right-angles to one another. Optionally, the layout of the webs 23 may be in a different geometric pattern, e.g. hexagonal, octagonal, etc. In order to improve strength, the webs 23 may be enclosed by a frame 24. The number of webs 23 is variable. For example, the unit 22 may have 16 sub-divisions as illustrated in FIG. 5 or 24 sub-divisions as illustrated in FIG. 6. Naturally, the unit 22 proposed by the invention may also have any other number of sub-divisions.

Bottom spacers 25 and side spacers 26 may be provided on the frame 24 of the unit 22 for placing it in a container 1. The bottom spacers 25 are provided on the bottom edge 27 of the webs or the frame 24. The side spacers 26 are disposed respectively on the longitudinal side 28, transverse side 29 and/or in the corners 30 of the frame 24 of the unit 22. In FIG. 5 for example, every longitudinal aide 28 and transverse side 29 has two spacers 26 each. FIG. 6 illustrates an alternative layout of the side spaces 26 at the corners 30 of the frame 24 of the unit 22.

Figure 7:
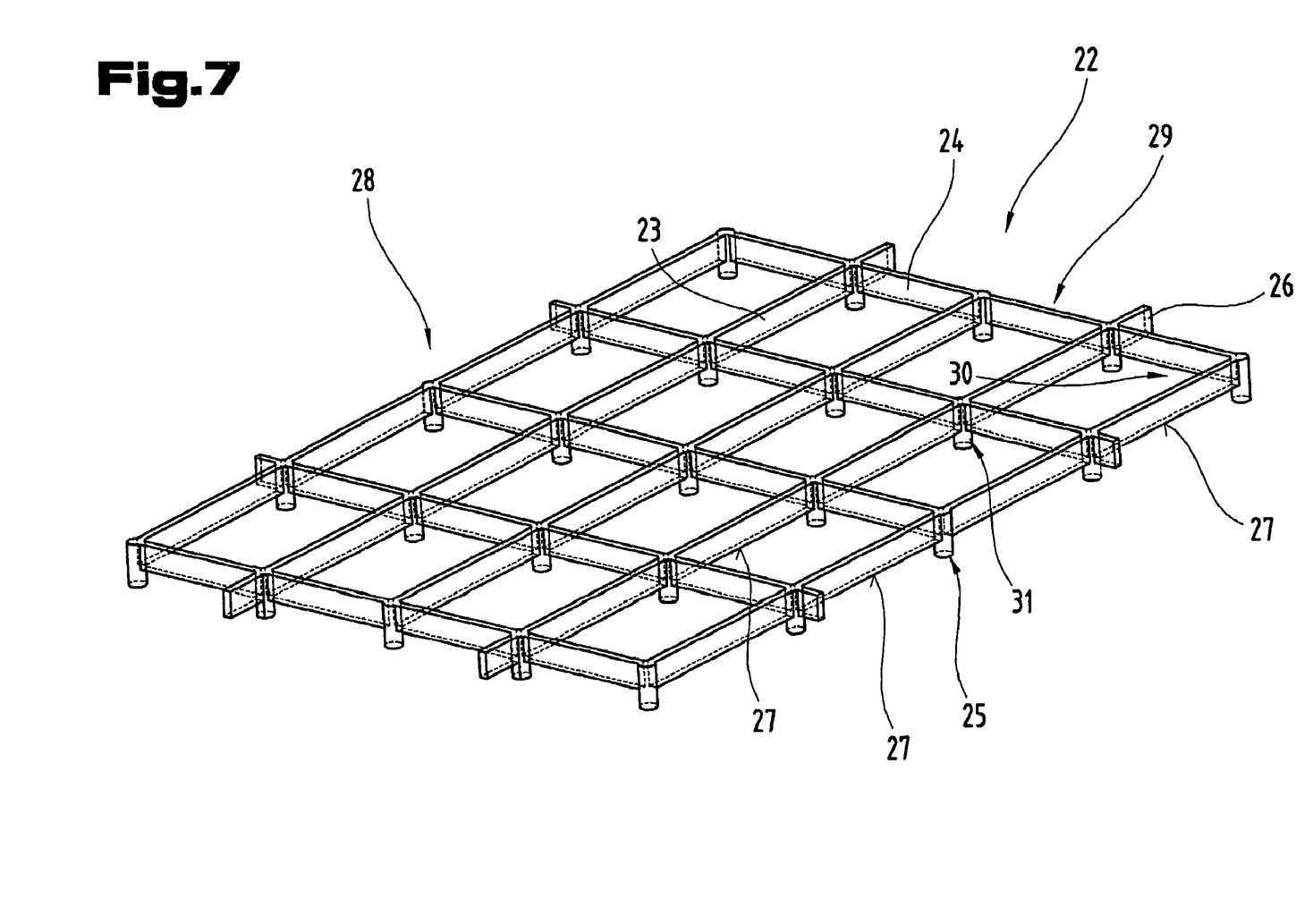
FIG. 7 shows a unit with cylindrical spacers.

FIG. 7 shows a perspective view of bottom spacers 25 for the base plate 3 of a unit 22 proposed by the invention. The spacers 25 may be disposed in the intersecting regions 31 of the webs 23 or on the webs 23 between the intersecting regions 31. The spacers 25, 26 may be cylindrical (FIG. 7), plate-shaped (FIG. 8), etc. In the region where they serve as spacers, the height of the webs 23 and the frame 24 is greater by a third to a half than in the regions where they do not serve as spacers. The fact that the unit 22 is retained in the base body 2 by the spacing and retaining system means that the hydrophobic liquid 9 disposed in the container 1 is uniformly distributed across the entire base plate 3. As a result of using the unit 22, movements of the hydrophobic liquid 9 are not propagated across the entire base plate 3 with the same intensity if the container 1 is vibrated because the unit 22 acts like a breakwater.

Figures 8, 9:
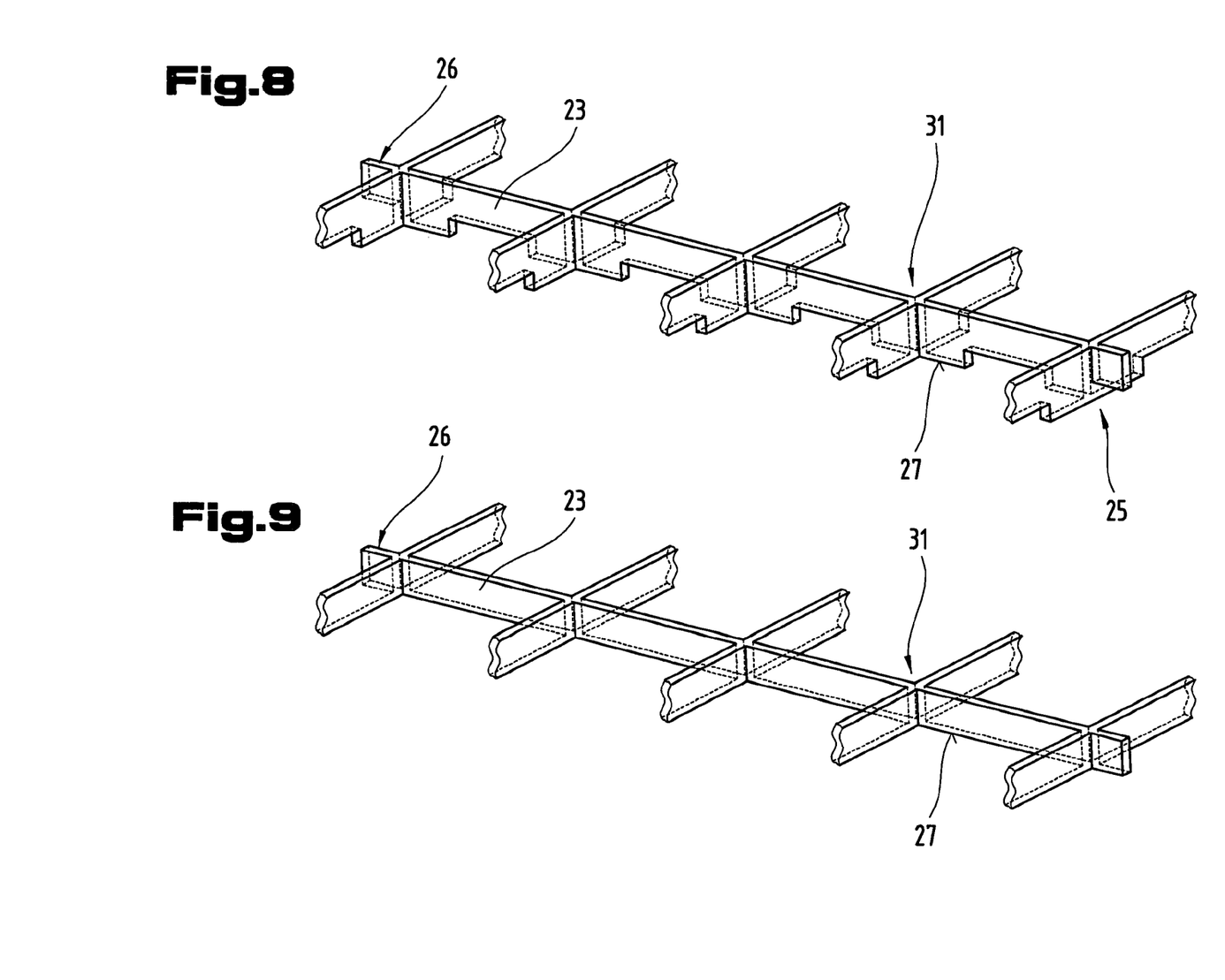
FIG. 8 shows a section through a unit with plate-shaped spacers.
FIG. 9 shows a section through a unit for dividing a volume.

FIG. 9 shows a section through a unit 22, in which the webs 23 of the unit 22 are designed to extend continuously as far as the base plate 3. As a result, many separate different reaction chambers 33 can be created. The hydrophobic liquid 9 placed in each well 5 can therefore be used in a different composition or concentration in each different reaction chamber 33. For example, this enables a row for diluting the crystallisation reagents 12 to be provided in order to test the bio-macro molecules 11 and/or the hydrophobic liquid 9. In this embodiment, the external dimensions of the unit 22 are slightly smaller than or the same size as the dimensions of the container 1.

The unit 22 may also be placed with the side spacers 26 on the side walls 4 of the base body 2. The bottom spacers 25 therefore project only into the reservoir 13 of the container 1. The height of the webs 23 and frame 24 in this embodiment is more than a third to a half higher in the regions where they serve as spacers than in the region where they do not act as spacers. In this embodiment, the external dimensions of the unit 22 are at least as big as or bigger than the dimensions of the container 1.

Figure 10:
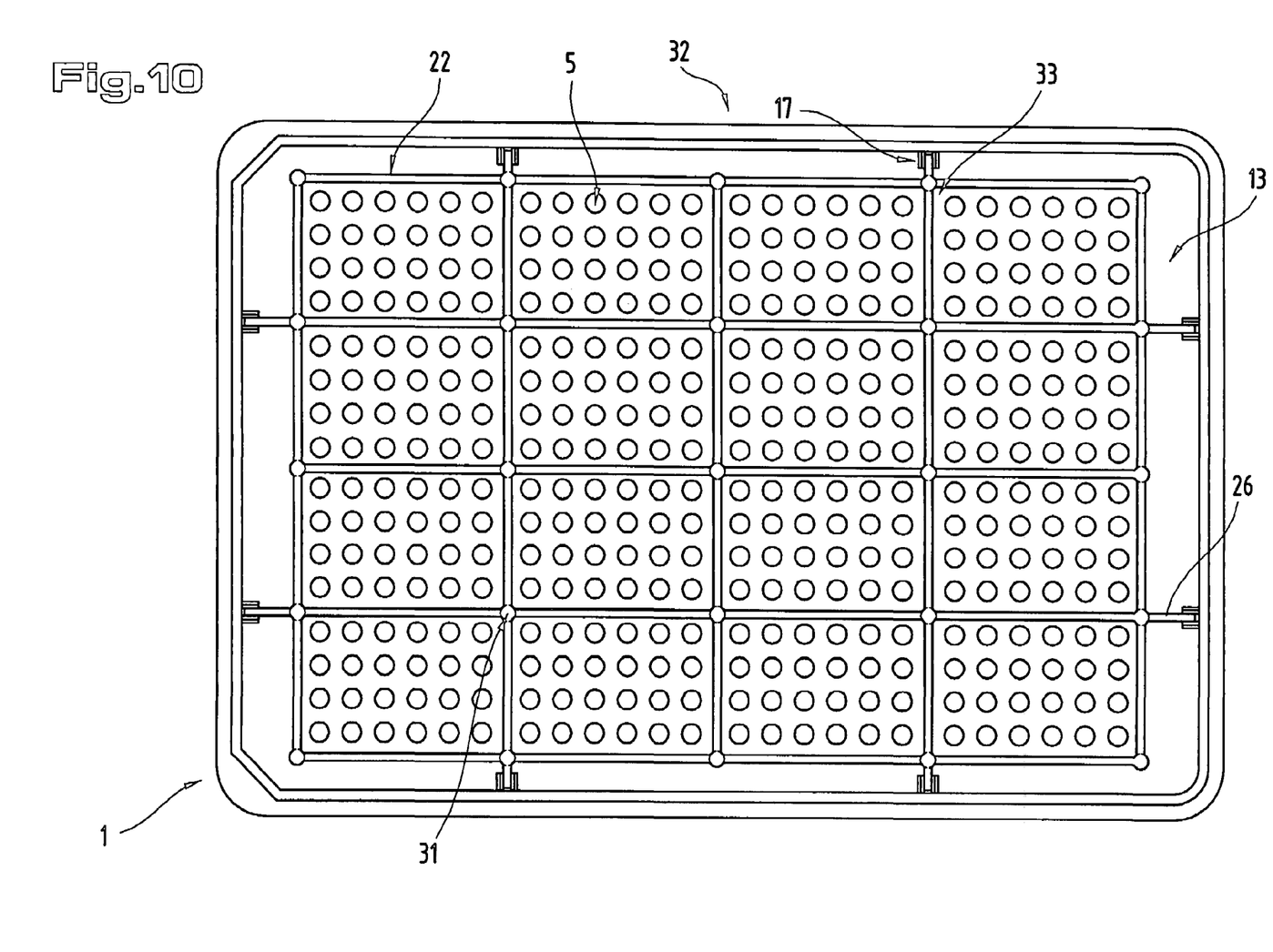
FIG. 10 shows a plan view of a crystallisation device.

FIG. 10 illustrates a plan view of a crystallisation device 32, comprising a container 1 and a unit 22 for sub-dividing a volume in the assembled state.

FIGS. 11 to 16 illustrate various different embodiments of the design used for the wells 5, seen from a side view. The bases 6 of the wells 5 may be at least approximately concave in curvature, i.e. the bases 6 or the base regions of the wells 5 may be designed in the shape of a cone, a truncated cone or cone section or a combination of such bodies by widening the wells 5. This design of the reaction regions 8 assists the task of depositing the drop 10. The base 6 of the wells 5 may be made from a transparent material, in which case the crystal growth in the reaction region 8 can be observed without the need for manipulation.

Figure 11:
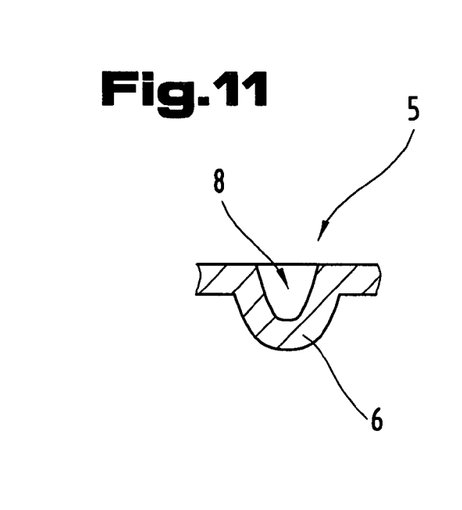
FIG. 11 shows a side view of a conical well with a semi-spherical base.

FIG. 11 shows a side view of a conical well 5 with a semi-spherical base 6.

Figure 12:
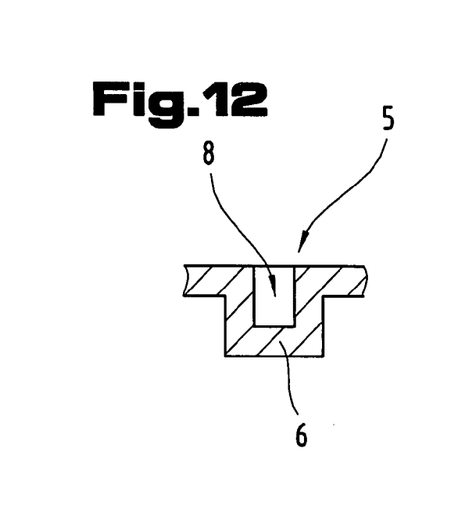
FIG. 12 shows a side view of a cylindrical well with a flat base.
Figure 13:
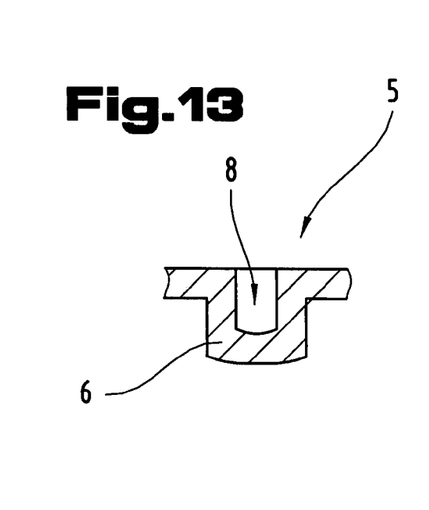
FIG. 13 shows a side view of a cylindrical well with a semi-spherical base.
Figure 14:
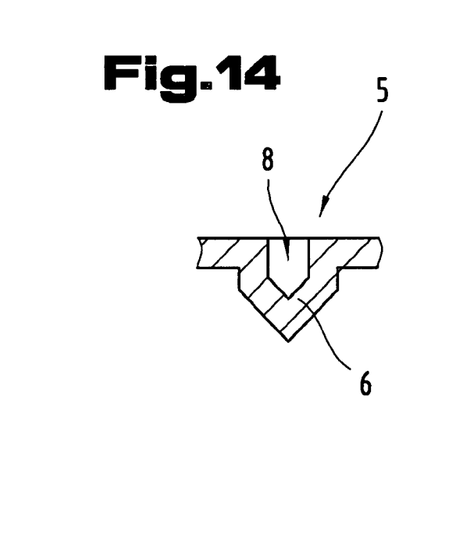
FIG. 14 shows a side view of a cylindrical well with a conical base.
Figure 15:
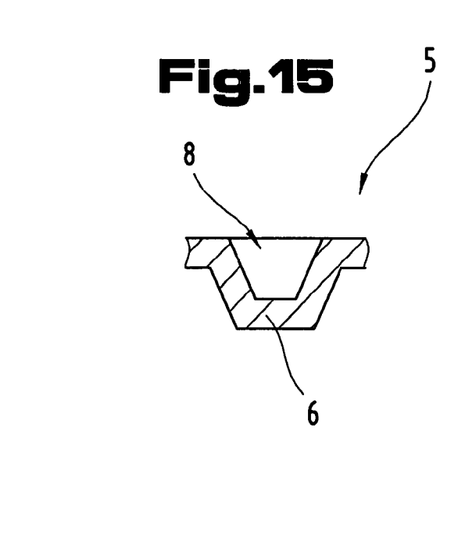
FIG. 15 shows a side view of a conical well with a flat base.
Figure 16:
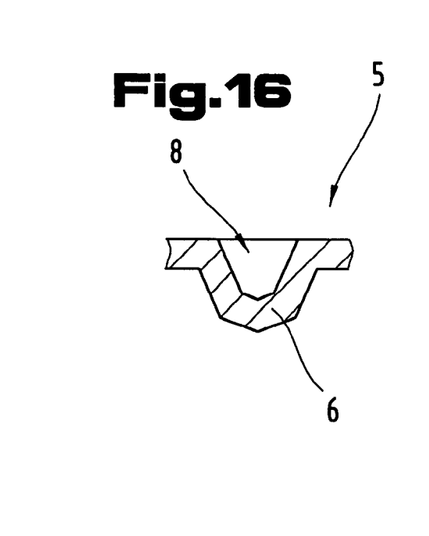
FIG. 16 shows a side view of a conical well with a conical base.

FIG. 12 shows a side view of a cylindrical well 5 with a flat base 6, FIG. 13 shows a side view of a cylindrical well 5 with a semi-spherical base 6 and FIG. 14 shows a side view of a cylindrical well 5 with a conical base 6. FIG. 15 gives a side view of a conical well 5 with a flat base 6 and FIG. 16 shows a side view of a conical well 5 with a conical base 6.

Figure 17:
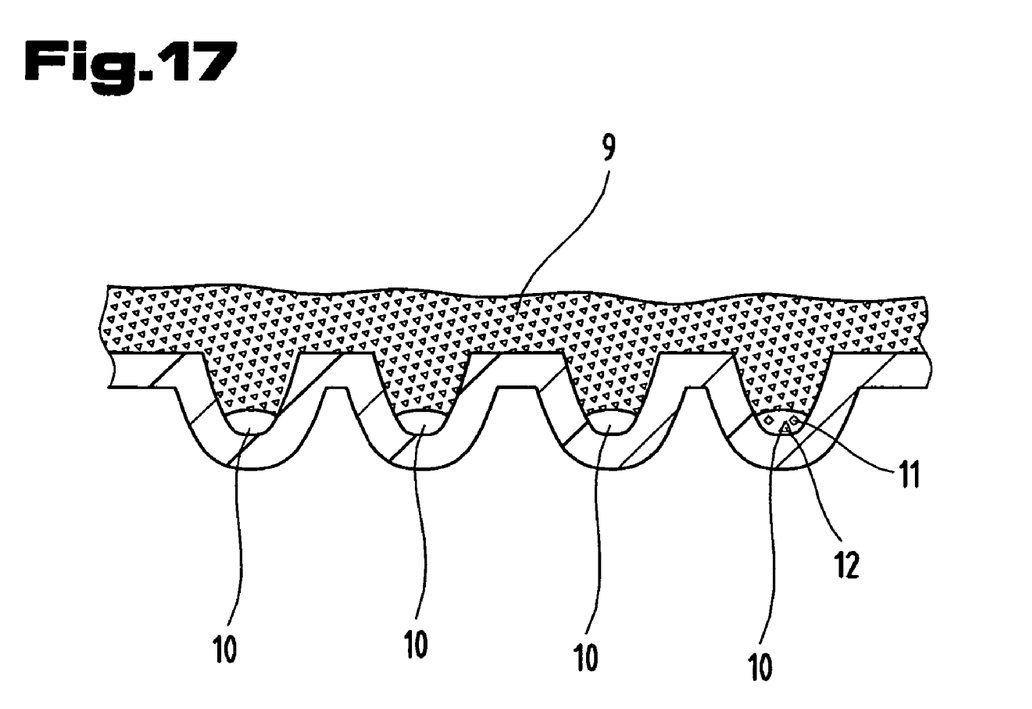
FIG. 17 is an operating diagram illustrating an example of how a crystallisation device is used.

FIG. 17 is an operating diagram illustrating how the crystallisation device 32 proposed by the invention is used for the micro-batch method. The reaction region 8 of the wells 5 of the container 1 is filled with a drop 10 comprising bio-macro molecules 11 and crystallisation reagents 12, whilst the hydrophobic liquid 9 is disposed in the container 1 and the wells 5. Diffusion may take place in the wells 5 between the drop 10 and the hydrophobic liquid 9. The reaction progress in the wells 5 may be observed with a microscope. An example of a reaction which can be conducted in a container 1 is one in which a crystal is produced from bio-macro molecules 11 dissolved in crystallisation reagents 12, as explained earlier in the description. A small quantity of bio-macro molecules 11 combined with crystallisation reagents 12 is pipetted under a layer of a hydrophobic liquid 9. The important factor about this method is that the reagents involved in the crystallisation must be present in a specific concentration and there must be no significant fluctuations in the concentration of the bio-macro molecule 11 or in the crystallisation reagents 12 in the drop 10. By varying the hydrophobic liquid 9, which might be paraffin oil and/or silicone oil, or by varying the ratio of the substances used to make up the hydrophobic liquid 9, a shift in concentration in the drop 10 can occur due to the diffusion of water through the oil. This results in an increase in concentration of the bio-macro molecule 11 and crystallisation reagents 12 under the hydrophobic liquid 9. This shift in concentration results in the formation of crystals, in particular single crystals. The crystals formed in the drop 10 can be observed or detected with the aid of a detection system.

The container 1 may optionally also be provided with a vessel cover. This vessel cover may be made from the same material as the container 1 or from a different plastic. In addition to the cover, the container 1 may also be provided with a film. This film may be adhered to the side walls 4 of the container 1. This film may also be joined to the webs 23 of the unit.

For the sake of good order, it should finally be pointed out that in order to provide a clearer understanding of the structure of the container 1, it and its constituent parts are illustrated to a certain extent out of scale and/or on an enlarged scale and/or on a reduced scale.

The independent solutions to the underlying objective of the invention may be found in the description.

Above all, the embodiments of the subject matter illustrated in FIGS. 1, 2, 3, 4, 5, 6, 7, 8, 9, 10, 11, 12, 13, 14, 15, 16, 17 constitute independent solutions proposed by the invention. The associated objectives and solutions may be found in the detailed descriptions of these drawings.

| List of reference numbers | |
|---|---|
| 1 | Container |
| 2 | Base body |
| 3 | Base plate |
| 4 | Side wall |
| 5 | Well |
| 6 | Base |
| 7 | Wall |
| 8 | Reaction region |
| 9 | Hydrophobic liquid |
| 10 | Drop |
| 11 | Bio-macro molecule |
| 12 | Crystallisation reagent |
| 13 | Reservoir |
| 14 | Surface |
| 15 | Recess |
| 16 | Dividing wall |
| 17 | Retaining element |
| 18 | Side part |
| 19 | Longitudinal side |
| 20 | Transverse side |
| 21 | Corner |
| 22 | Unit |
| 23 | Web |
| 24 | Frame |
| 25 | Spacer (bottom) |
| 26 | Spacer (side) |
| 27 | Bottom edge |
| 28 | Longitudinal side of the unit |
| 29 | Transverse side of the unit |
| 30 | Corner of the unit |
| 31 | Intersecting region |
| 32 | Crystallisation device |
| 33 | Reaction chamber |

The invention claimed is:

1. A container comprising a base body consisting of a base plate and side walls standing up therefrom in an at least almost perpendicular arrangement, wells disposed in the base body which are provided in the form of a recess in the base plate, the side walls being disposed in an at least substantially opposite direction from the recesses in order to accommodate a volume of the container, and a lattice-type unit within the container for sub-dividing the volume into part-regions.

2. The container as claimed in claim 1, wherein the wells are arranged in a uniform pattern.

3. The container as claimed in claim 1, comprising 6, 12, 24, 48, 96, 384 or 1536 wells.

4. The container as claimed in claim 1, wherein the wells are of a conical or cylindrical design.

5. The container as claimed in claim 2, wherein the wells have a capacity selected from a range with a lower limit of 0.01 µl, and an upper limit of 50 µl.

6. The container as claimed in claim 1, wherein the wells have bases disposed in a plane parallel with a container support surface.

7. The container as claimed in claim 1, wherein the base plate and the wells are disposed in a plane parallel with a container support surface.

8. The container as claimed in claim 1, wherein the wells are surface treated with aldehyde, silane, epoxy, thiol, polyethylene glycol (PEG), polyoxyethylene-sorbitan-monolaureate, magnetic materials, streptavidin or biotin.

9. The container as claimed in claim 1, wherein the wells are square, rectangular, conical or semi-spherical as seen from a side view.

10. The container as claimed in claim 1, wherein the wells are round, quadrangular, hexagonal, octagonal or in the shape of a parallelogram as seen in top view.

11. The container as claimed in claim 1, wherein the base plate between the wells is at least partially non-transparent.

12. The container as claimed in claim 1, wherein the surface of the base plate between the wells is surface-treated with a hydrophobic substance or has a hydrophobic mask applied to it.

13. The container as claimed in claim 1, wherein the base body is made from a material selected from a group consisting of polypropylene, polystyrene, acrylo-butadiene-styrene, polyamide, polycarbonate, polymethyl methacrylate, polysulphone, cyclo-olefin copolymer, polymethyl pentene and/or styrene-acrylonitrile.

14. The container as claimed in claim 1, wherein the base body is made from several different materials.

15. The container as claimed in claim 1, wherein a co-ordinate marker is provided for indicating the layout of the wells in the base plate.

16. The container as claimed in claim 1, wherein the base body is preferably made by an injection-moulding process.

17. The container as claimed in claim 1, wherein a recess is provided on a longitudinal side and/or on a transverse of the base body.

18. The container as claimed in claim 1, comprising at least one retaining element on the side walls of the container for a lattice-type unit.

19. The container as claimed in claim 1, wherein webs of the lattice-type unit are surrounded by a frame.

20. The container as claimed in claim 1, comprising spacers on the bottom face of the lattice-type units to establish a flow connection between the part-regions.

21. The container as claimed in claim 19, wherein the webs of the lattice-type units are disposed at right-angles to one another.

22. The container as claimed in claim 19, wherein the height of the lattice-type units in intersecting regions of the webs is one third to a half higher than it is between the intersecting regions.

23. The container as claimed in claim 19, wherein the webs and/or the frame are of identical height.

24. The container as claimed in claim 19, wherein the frame has spacers for holding the lattice-type units at a distance from the side walls of the container.

25. The container as claimed in claim 1, wherein the external dimensions are slightly smaller than the dimensions of the container.

26. The container as claimed in claim 1, wherein made from a material selected from a group consisting of polypropylene, polystyrene, acrylo-butadiene-styrene, polyamide, polycarbonate, polymethyl methacrylate, polysulphone, cylo-olefin copolyrmer, polymethyl pentene and/or styrene-acrylo-nitrile.

27. The container as claimed in claim 1, wherein the wells are at least partially of a transparent synthetic resin.

* * * * *